US007196968B2

(12) United States Patent
Okuno et al.

(10) Patent No.: US 7,196,968 B2
(45) Date of Patent: Mar. 27, 2007

(54) METHOD OF DRIVING DATA LINES, AND DISPLAY DEVICE AND LIQUID CRYSTAL DISPLAY DEVICE USING METHOD

(75) Inventors: Harumi Okuno, Kawasaki (JP); Junichi Yamada, Nabari (JP); Hisashi Nagata, Yokohama (JP)

(73) Assignee: Sharp Kabushiki Kaisha, Osaka (JP)

( * ) Notice: Subject to any disclaimer, the term of this patent is extended or adjusted under 35 U.S.C. 154(b) by 82 days.

(21) Appl. No.: 10/986,033

(22) Filed: Nov. 12, 2004

(65) Prior Publication Data

US 2005/0281127 A1 Dec. 22, 2005

(30) Foreign Application Priority Data

Nov. 13, 2003 (JP) ............................ 2003-384183

(51) Int. Cl.
*G11C 8/00* (2006.01)

(52) U.S. Cl. ......................... 365/239; 365/108; 345/87

(58) Field of Classification Search ................ 365/233, 365/108, 185.23, 109, 161, 112, 189.05, 230.06, 365/239; 345/87

See application file for complete search history.

(56) References Cited

U.S. PATENT DOCUMENTS

| | | | |
|---|---|---|---|
| 6,791,526 B2 * | 9/2004 | Kubota et al. .............. 345/100 | |
| 2001/0020929 A1 | 9/2001 | Nagata et al. | |
| 2002/0021606 A1 * | 2/2002 | Tsuchi ........................ 365/203 | |
| 2002/0080109 A1 | 6/2002 | Nagata et al. | |
| 2004/0041772 A1 | 3/2004 | Yamashita et al. | |

FOREIGN PATENT DOCUMENTS

| | | |
|---|---|---|
| EP | 1 069 457 A1 | 1/2001 |
| JP | 10-39278 A | 2/1998 |
| JP | 11-065536 | 3/1999 |
| JP | 2000-221476 | 8/2000 |
| JP | 2003-122313 | 4/2003 |
| JP | 2003-122318 | 4/2003 |

* cited by examiner

*Primary Examiner*—Van Thu Nguyen
*Assistant Examiner*—Dang Nguyen
(74) *Attorney, Agent, or Firm*—Harness, Dickey & Pierce, P.L.C.

(57) ABSTRACT

A method of driving source lines is arranged as follows: One output signal line S61 of a source driver is connected to a plurality of lines corresponding to respective source lines SR7 through SB12, and these source lines from SR7 (starting data line) to SB12 (terminating data line) are grouped as one block (group). In each block, a signal voltage of a divided output is supplied to the source lines during a first horizontal period T, while a signal voltage whose polarity is opposite to that of the aforesaid output is supplied to the source lines in a second horizontal period that is after the first horizontal period. In each of the horizontal periods, the source lines SR7 through SB12 are subjected to sequential selection. In addition to this, the source line SB12 is selected before turning the source line SR7 off. With this, a method of driving source lines, which can restrain (eliminate) the voltage variation on each source line and pixel electrode on account parasitic capacities between source lines, can be realized.

11 Claims, 7 Drawing Sheets

METHOD OF DRIVING DATA LINES, AND DISPLAY DEVICE AND LIQUID CRYSTAL DISPLAY DEVICE USING METHOD

This Nonprovisional application claims priority under 35 U.S.C. § 119(a) on Patent Application No. 2003-384183 filed in Japan on Nov. 13, 2003, the entire contents of which are hereby incorporated by reference.

FIELD OF THE INVENTION

The present invention relates to a method of driving data lines, and particularly to a method of driving source lines of a liquid crystal display device.

BACKGROUND OF THE INVENTION

FIG. 5 is a block diagram showing a liquid crystal display device in which a plurality of source lines are driven by dividing, using switches, one output (signal voltage) from a source driver.

As in the figure, on the surface of a display section 195 of the liquid crystal display device, a plurality of gate lines G190, G191, . . . provided in crosswise and a plurality of source lines SR101, . . . , SB112, . . . provided in lengthwise are laid out in a matrix manner. For instance, at the respective intersections of the gate line G191 and the source lines TR125 through TB136, then-film transistors TR125 through TB136 are formed as switching elements.

The gates of the respective thin-film transistors TR125 through TB136 are connected to the gate line G191, and the sources of the respective thin-film transistors TR125 through TB136 are connected to the corresponding source lines SR101 through SB112. The drains of the respective thin-film transistors TR125 through TB136 are connected to corresponding pixel electrodes PR113 through PB124.

Every six source lines are grouped as one block (B154, B155), and the source lines in one block are connected to an output (S160 or S161) of a source driver 170, via dividing switches SWR137 though SWB148 that are, for instance, transistors and are provided on the respective source lines SR101 through SB112.

For instance, in the block B154, six source lines SR101, SG102, SB103, SR104, SG105, and SB106 are connected to the drains of the dividing switches SWR137, SWG138, SWB139, SWR140, SWG141, and SWB142, respectively. The sources of these dividing switches SWR137 though SWB142 are connected to one output S160 of the source driver 170, the output S160 corresponding to the block B154. Also, the gates of the dividing switches SWR137 through SWB142 are connected to six dividing switch lines SWL149, SWL150, SWL151, SWL152, SWL153, and SWL154, respectively.

In the display section 195 being thus arranged, the dividing switches SWR137 through SWR148 are sequentially turned on, in the meanwhile one gate line (either G190 or G191) is in the state of selection (on state). With this, the output (signal voltage, either S160 or S161) from the source driver 170 is sequentially written into pixel electrodes PR113 through PB124.

The following will specifically describe a conventional method of driving the above-described display section 195, in reference to FIGS. 5 and 6.

FIG. 6 is a timing chart regarding the block 155, on the occasion of displaying a uniform color, e.g. a halftone, on the whole screen. In the figure, a reference sign T indicates one horizontal period (a period for scanning one gate line).

It is also noted that the figure relates to three horizontal periods (periods for scanning three gate lines including the gate lines G190 and G191).

That is to say, during the period T, the signal voltage S161 is sequentially supplied from the source driver 170 to six source lines SR107 through SB112 of the block B155. With this, the signal voltage S161 is sequentially written into the pixel electrodes PR119 through PB124 of the block B155. Furthermore, in synchronism with the above, the signal voltage S160 is written into the pixel electrodes PR113 through PB118 of the block B154. As a result, during the period T, the signal voltages (S160, S161 and the like) supplied from the source driver 170 are written into all of the pixel electrodes (PR113, . . . ) connected to the gate line G191.

It is noted that each of the signal voltages with which the source lines (SR107 through SB112) and the pixel electrodes (PR119 through PB124) are charged has a driving waveform such as S161 (shown at the top of FIG. 6). In the above-described driving method, the polarity of the signal voltage S161 is reversed in each horizontal period T.

As illustrated in FIGS. 5 and 6, in synchronism with the selection (turn-on) of the gate line G191 at a time t0, an ON signal is supplied to the dividing switch SWR143 via the dividing switch line SWL149, and the signal voltage S161 is supplied from the source driver 170 to the source line SR107. On this occasion, the polarity of the voltage on the source line SR107 is caused to be in reverse to the polarity of the voltage that was supplied in the immediately preceding horizontal period (e.g. a period for scanning G190).

Then the signal voltage S161 having been supplied from the source driver 170 to the source line SR107 is written into the pixel electrode PR119 via the source and drain of the thin-film transistor (TR131).

Next, in synchronism with the turn-off of the dividing switch SWR143 at a time t1, the ON signal is supplied to the dividing switch SWR144 via the dividing switch line SWL150, while the signal voltage S161 is supplied from the source driver 170 to the source line SG108. Also on this occasion, the polarity of the voltage on the source line SG108 is caused to be in reverse to the polarity of the voltage supplied in the immediately preceding horizontal period. (In other words, provided that the polarity of the signal voltage S161 is positive during the times t0 through t7, the polarity of the voltage on the source line SG108 is reversed to be negative.)

Then the signal voltage S161 having been supplied from the source driver 170 to the source line SG108 is written into the pixel electrode PG120.

At a time t2, the ON signal is supplied to the dividing switch SWB145 concurrently with the turn-off of the dividing switch SWG144, and the signal voltage S161 (positive signal voltage) is supplied from the source driver 170 to the source line SB109. Then the signal voltage S161 having been supplied to the source line SB109 is written into the pixel electrode PB121.

In a similar manner, from a time t3 to a time t5, the signal voltage S161 is written into the pixel electrodes PR122 though PB124.

The above-described driving method, however, has the following drawback. That is, the voltages on the source lines SR101 through SB112 are varied on account of parasitic capacities between the source lines SR 101 through SB112, so that the voltages written into the pixel electrodes PR113 through PB124 are varied. By the way, FIG. 7 schematically shows the parasitic capacities C201 through C211 existing between the source lines (SR101 through SB112).

For instance, in the case of the source lines SR107 and SG108, the polarity is changed, at the time t0, from negative at the time of the directly preceding horizontal period to positive, and the signal voltage S161 of the source driver 170 is written into the pixel electrode PR119 (i.e. the pixel electrode PR119 is charged with the signal voltage S161) until the time t1. Note that, during this period, while the polarity of the source line SR107 is positive, the polarity of the neighboring source line SG108 has been negative since the directly preceding horizontal period.

After the dividing switch SWR143 is turned off at the time t1, the dividing switch SWG144 is turned on, and the polarity of the source line SG108 is reversed from negative to positive. In response to this, a voltage on account of a parasitic capacity (C207, see FIG. 7) between the SR107 and SG108 flows into the source line SR107 and the pixel electrode PR119. As a result, the voltages having been written into the source line SR107 and the pixel electrode PR119 are varied (overshot).

At the time t2, a voltage on account of a parasitic capacity C208 (see FIG. 7) between the source line SG108 and the source line SB109 flows into the source line SG108 and the pixel electrode PG120, so that the voltages having been written into the source line SG108 and the pixel electrode PG120 are varied (overshot). Similarly, from the time t3 to the time t5, the voltages having been written into the source lines SB109 through SG111 and the pixel electrodes PB121 through PG123 are varied (overshot).

Furthermore, at the time t5 at which the dividing switch SWB148 is turned on, the SWB142 of the block 154 is also turned on. On this occasion, the dividing switch SWR143 of the block 155 is in the off state. For this reason, when the polarity of the source line SB106 is reversed from negative to positive, a voltage on account of a parasitic capacity C206 (see FIG. 7) between the source line SB106 and the source line SR107 flows into the source line SR107 and the pixel electrode PR119, and the voltages having been written into the source line SR107 and the pixel electrode PR119 are overshot again (for the second time).

FIG. 6 schematically shows how the aforesaid voltage variations (overshoot) occur. Note that, the voltage variations are indicated by sections where the waveforms of the respective source lines (SR107 through SB112) and pixel electrodes (PR119 through PB124) are overlapped with each other.

More specifically, at the time t1, the source line SR107 (pixel electrode PR119) is overshot for the first time, and in similar manners, the first overshoots occur in the source line SG108 (pixel electrode PG120) at the time t2, in the source line SB109 (pixel electrode PB121) at the time t3, and in the source line SR110 (pixel electrode PR122) at the time t4. Moreover, at the time t5, the source line SG111 (pixel electrode PG123) is overshot for the first time and the source line SR107 (pixel electrode PR119) is overshot for the second time.

As a result of the above, in each block (B154, B155) shown in FIG. 5, a voltage which has been overshot and increased twice from the target voltage is consequently written into the pixel electrode (PR113 or PR119) that is subjected to the voltage writing at the start, and voltages which have been overshot and increased once from the target voltages are consequently written into the remaining pixel electrodes (PG114 through PR116 and PG120 through PG123), except into the pixel electrode (PB118 or PB124) that is subjected to the voltage writing at the last.

On account of this, a striped pattern appears vertically (i.e. along the source lines) in each block, when an image is reproduced.

To solve this problem, a patent document 1 (Japanese Laid-Open Patent Application No. 11-338438/1999; published on Dec. 10, 1999, corresponding to EP1069457) discloses a method that focuses attention on the differences between transmittances of R, G, and B at a given voltage. More specifically, according to this method, three signal lines are grouped as one block (i.e. an output of one source driver is divided into three), the signal line that is selected at the start (i.e. firstly) is designated as "B" where the variation of brightness on account of voltage rise is minimum, and the signal line that is selected at the last (i.e. thirdly) is designated as "R" where the variation of brightness on account of voltage rise is maximum.

With this, even if the voltage variation on account of the parasitic capacity between the signal lines occurs, the differences between the brightness of R, G, and B can be compensated. Also, since the voltage variations in the respective signal lines are caused to be substantially equal to each other, the aforesaid voltage variation is not conspicuous.

However, the method disclosed by the patent document 1 is a technology that makes the aforesaid striped pattern on account of the voltage variation be inconspicuous by dividing the output of one source driver into three (i.e. by performing time-division) so as to determine, in consideration of the transmittances of R, G, and B at a given voltage, the colors corresponding to the respective signal lines. Therefore, this method causes the striped pattern on account of the voltage variations to be unnoticeable.

In other words, since the voltage variations on the respective signal lines are not fully eliminated, there is a limit to the improvement in the image quality.

Furthermore, to substantially equalize the voltage variations on the respective signal lines of R, G, and B, it is necessary to divide (i.e. perform time-division) the output from the source driver into three, and also to designate the first signal line as B and the third signal line as R, at the time of grouping the signal lines into blocks by setting the time-division number to be 3. It is noted that such limitations significantly decrease the design freedom of the device.

In addition to the above, a patent document 2 (Japanese Laid-Open Patent Application No. 10-39278/1998; published on Feb. 13, 1998) discloses such an arrangement that, before applying a display signal during a period in which a pixel is selected, signal voltages whose polarities are identical with that of the display signal are simultaneously applied to respective vertical lines, thereby preventing the variation of the voltage level of the display signal on account of the voltage that had been kept before the application of the display signal to liquid crystal.

SUMMARY OF THE INVENTION

The objective of the present invention is to provide a method of driving a liquid crystal display device, by which a striped pattern on a reproduced image is restrained to be inconspicuous to a great extent, by restraining the voltage variations on source lines on account of parasitic capacities, and the degree of design freedom for the device is increased.

To achieve this objective, a method of driving a plurality of data lines is characterized in that, for causing output means to perform writing into the plurality of data lines, one output from the output means being divided into divided outputs corresponding to the plurality of data lines, the plurality of data lines being grouped into groups each made up of data lines from a starting data line to a terminating data line, the method comprising the steps of: in each of said groups, (I) providing a signal voltage of one of said divided outputs to a data line selected by a switch, during a first predetermined period; and (II) providing a signal voltage, whose polarity is opposite to a polarity of the signal voltage in the step (I), to a data line selected by a switch, during a second predetermined period subsequent to the first predetermined period, the step (I) comprising the sub-step of: (i) performing sequential selection of the data lines from the starting data line to the terminating data line; and (ii) apart from the sequential selection of the terminating data line, selecting the terminating data line before causing the starting data line to be in an off state, the step (II) comprising the sub-step of: (a) performing sequential selection of the data lines from the starting data line to the terminating data line; and (b) apart from the sequential selection of the terminating data line, selecting the terminating data line before causing the starting data line to be in an off state, the sub-steps (i) in the respective groups being synchronized with each other, the sub-steps (ii) in the respective groups being synchronized with each other, the sub-steps (a) in the respective groups being synchronized with each other, and the sub-steps (b) in the respective groups being synchronized with each other.

According to the above-described method, a group corresponding to one output has data lines from a starting data line to a terminating data line, and at the border between two neighboring groups, the starting data line of one group is juxtaposed with the terminating data line of the other group.

According to the above-described method, in each of the predetermined periods, apart from the sequential selection from the starting data line to the terminating data line, the selection of the terminating data line (hereinafter, this selection of the terminating data line is at times referred to as initial selection) is performed. In other words, the terminating data line is selected twice in one predetermined period, e.g. the initial selection is the first time and the sequential selection is the second time.

Therefore, the data lines (hereinafter, at times referred to as data lines from the first starting data line to the first terminating data line) are driven in the following manner.

First, before or after the sequential selection of the first starting data line, the initial selection of the first terminating data line is performed. This initial selection can be performed either before or after the selection (sequential selection) of the first starting data line, on condition that the initial selection is performed before the turn-off of the sequentially-selected first starting data line.

As a result of this initial selection, a signal voltage is supplied from the output means to the first terminating data line. Since this signal voltage has a polarity opposite to the (e.g. negative) polarity of a signal voltage supplied on the occasion of the sequential selection during the first predetermined period, the polarity of the voltage on the first terminating data line is reversed (from negative to positive). Furthermore, in synchronism with this selection of the first terminating data line, the terminating data line, which belongs to the group neighboring to the group of the aforesaid first terminating data line and is next to the first starting data line, is selected, and a signal voltage from the output means is supplied to this terminating data line. With this, the polarity of the voltage on the second terminating data line is also reversed (from negative to positive).

On this occasion, since the initial selections of the first and second terminating data lines are performed before causing the first starting data line not to be in the state of selection (sequential selection), the first starting data line does not, on the occasion of the aforesaid initial selection, suffer from the voltage variation on account of a parasitic capacity between the first starting data line and the second terminating data line.

After the initial selection of the first terminating data line (or before the initial selection as described above), the first starting data line is selected (i.e. the sequential selection of the first starting data line is performed). As a result, a signal voltage is supplied from the output means to the first starting data line. Subsequently, the sequential selections up to the first terminating data line are performed.

On the occasion of this sequential selection (selection for the second time) of the first terminating data line, the polarity of the first terminating data line has been reversed (to positive) since the initial selection (selection for the first time), and hence the polarity of the first terminating data line does not change (i.e. remains positive) on the occasion of the sequential selection (selection for the second time).

In synchronism with the sequential selection (selection for the second time) of the first terminating data line, the second terminating data line is also subjected to the sequential selection (i.e. selected for the second time). The polarity of this second terminating data line has also been identical with the (positive) polarity of the first starting data line, since the initial selection (selection for the first time). For this reason, the polarity of the second terminating data line does not change (remains positive) at the time of the sequential selection (selection for the second time).

Note that, by the sequential selection (selection for the second time) of the first terminating data line, a desired signal voltage is eventually supplied from the output means to the first terminating data line.

As a result of the above-described driving of the data lines, the following effects can be obtained.

First, as described above, on the occasion of the sequential selections (selections for the second time) of the first and second terminating data lines as the last selections in the respective predetermined periods, the polarity of the second terminating data line does not change from the polarity that was set at the time of the initial selection (selection for the first time) and is identical with the (positive) polarity of the first starting data line that is next to the second terminating data line. At this moment, an electric charge (parasitic capacity) between the second terminating data line and the first starting data line having an identical polarity is negligibly small, as compared to a case where these data lines have different polarities.

On this account, it is possible to prevent the voltage variation of the first starting data line on account of the parasitic capacity, when the first terminating data line is subjected to the sequential selection (i.e. is selected for the second time).

Also, on the occasion of the sequential selections (selections for the second time) of the first and second terminating data lines, the polarity of the first terminating data line does not change from the polarity that was set at the time of the initial selection (selection for the first time) and is identical with the (positive) polarity of the neighboring (directly preceding) data line. As described above, an electric charge (parasitic capacity) between the neighboring data lines having an identical polarity is negligibly small.

For this reason, it is possible to prevent the voltage variation on account of the parasitic capacity from occurring to the data line that is immediately prior to the first terminating data line, when the first terminating data line is subjected to the sequential selection.

In this manner, according to the aforesaid method, the numbers of the voltage variations on the data lines that are immediately prior to the starting and terminating data lines, the voltage variations being caused by the parasitic capacities, can be decreased for once, respectively, as compared to the conventional art illustrated in FIG. 6.

With this, when, for instance, the data lines are adopted as source lines for writing signal voltages to pixels (pixel electrodes) of a display device, the occurrence of a vertically-striped pattern along the source lines is restrained.

Furthermore, since the voltage variation of the starting data line neighboring to the terminating data line (that does not suffer from the voltage variation on account of the parasitic capacity) is restrained, the vertically-striped pattern is caused to be unnoticeable when the aforesaid data lines are adopted to source lines of a display device, as compared to the conventional art (see FIG. 6) in which a source line undergoing the voltage variation twice is provided next to a source line not undergoing the voltage variation.

Furthermore, when, as described above, the aforesaid data lines are adopted as source lines of a (color) display device, the number of divisions by switches is not limited as in the conventional art disclosed by the patent document 1, and the order of colors (e.g. the order of R, G, and B) corresponding to the respective data (source) lines can be freely determined. For these reasons, the design freedom of the device is increased as compared to the conventional art.

For a fuller understanding of the nature and advantages of the invention, reference should be made to the ensuing detailed description taken in conjunction with the accompanying drawings.

DESCRIPTION OF THE EMBODIMENTS

Figure 1:
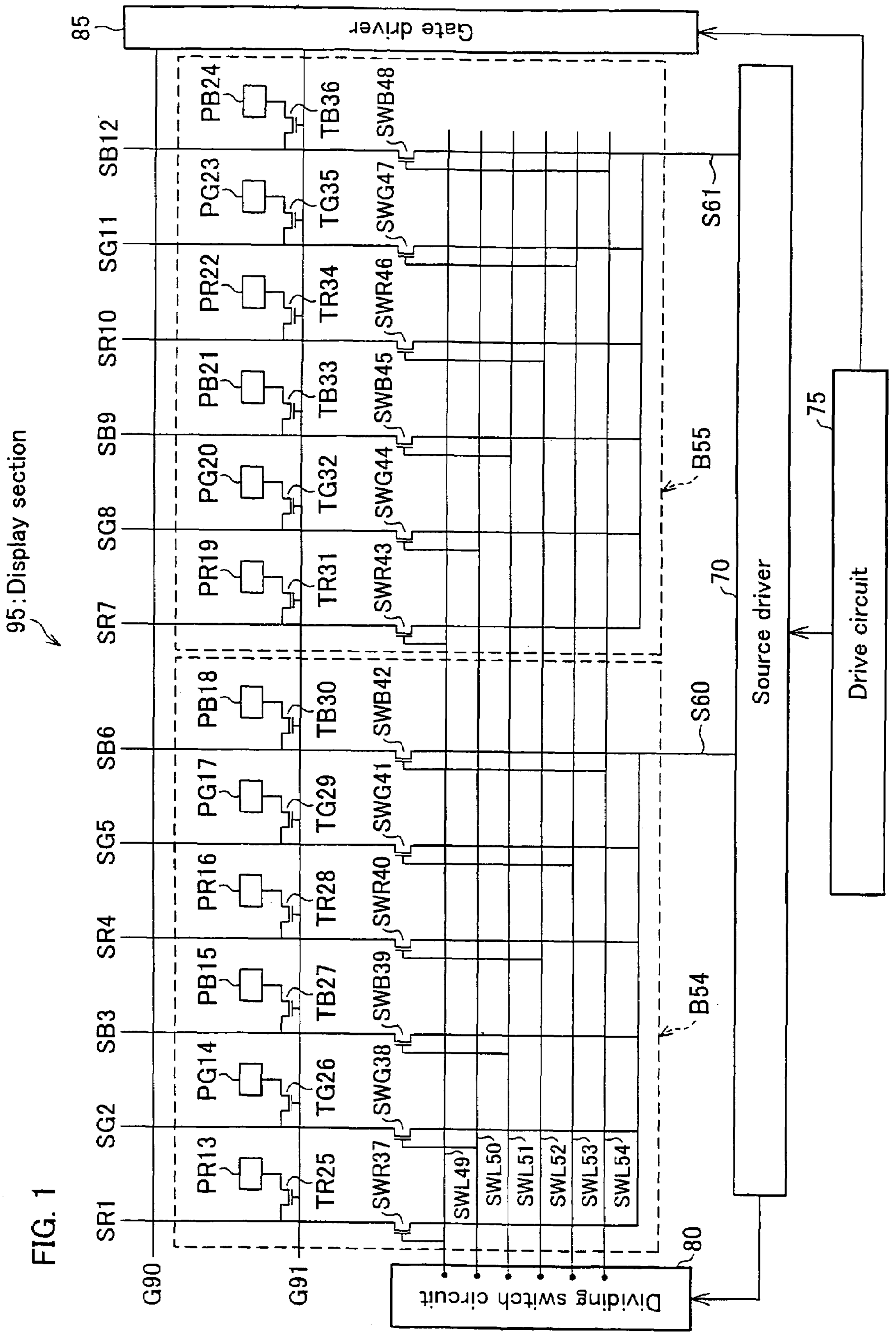
FIG. 1 is a block diagram illustrating a display section of a liquid crystal display device of the present invention.

FIG. 1 is a block diagram of a display device (display section) adopting a method of driving data (source) lines in accordance with the present invention.

On the surface of a display section 95, rows of gate lines G90, G91, . . . and columns of source lines (data lines) SR1 through SB12, . . . are provided in a matrix manner. At the respective intersections of these gate lines and source lines, thin-film transistors TR25 through TB36, . . . are formed as switching elements. For instance, at the respective intersections of the gate line G91 and the source lines SR1 through SB12, the thin-film transistors TR25 through TB36 are formed. The gate of one thin-film transistor (e.g. one of the thin-film transistors TR25 through TB36) is connected to a corresponding gate line (e.g. G91), the source of one thin-film transistor is connected to a corresponding source line (e.g. one of the source lines SR1 through SB12), and the drain of one thin-film transistor is connected to a corresponding pixel electrode (e.g. one of the pixel electrodes PR13 through PB24).

Note that, reference signs "R", "G", and "B" correspond to red, green, and blue. For instance, "SR" indicates a source line corresponding to red, "PR" indicates a pixel electrode corresponding to red, and "SWR" indicates a dividing switch corresponding to red. In the present embodiment, the source lines in each block (e.g. source lines SR1 through SB6 in the block B54) correspond to the respective colors in the order of R, G, B, R, G, B, and so on.

As indicated by B54 and B55 in the figure, each six of the source lines SR1 through SB12 are grouped as one block. Incidentally, it is noted that each of the blocks B54 and B55 corresponds to a group of data lines from a starting data line to a terminating data line, which is defined in claims. Now, two groups of the source lines SR1 through SB12 are connected to respective output signal lines S60 and S61 extending from a source driver 70, via dividing switches SWR37 through SWB48 that are transistors and the like and are provided on the respective source lines SR1 through SB12. Note that, each of these dividing switches SWR37 through SWB48 correspond to a switch defined in claims.

In other words, the source driver 70 is provided with the output signal lines S60 and S61 corresponding to the respective blocks B54 and B55. Each output signal line (e.g. S60) is connected to the source lines (e.g. SR1 through SB6) in the corresponding block (e.g. B54), via the dividing switches (e.g. SWR37 through SWB42) that correspond to the respective source lines.

Moreover, in order to cause the dividing switches (e.g. SWR37 through SWB42) corresponding to the source lines (e.g. SR1 through SB6) of one block (e.g. B54) to turn on/off at each independent timing, the display section 95 is provided with dividing switch lines SWL49, SWL50, SWL51, SWL52, SWL53, and SWL54 for controlling the switching of the respective dividing switches, and each dividing switch (e.g. SWR37) is connected to the corresponding dividing switch line (e.g. SWL49). Note that, in the present embodiment, since six source lines are provided in each block, the number of the dividing switch lines in the display section 95 is six.

More specifically, in the block B54, six source lines SR1 (starting data line), SG2, SB3, SR4, SG5, and SB6 (terminating data line) are connected to the respective drains of the dividing switches SWR37, SWG38, SWB39, SWR40, SWG41, and SWB42. The sources of the dividing switches SWR37 through SWB42 are connected to the output signal line S60 that is connected to the source driver 70 and corresponds to the block B54, and the gates of these dividing switches SWR37 through SWB42 are connected to six dividing switch lines SWL49, SWL50, SWL51, SWL52, SWL53, and SWL54, respectively.

From a driving circuit 75, a shift clock signal and a shift start signal are supplied to the gate driver 85, and the gate driver 85 sequentially accesses, using an output therefrom, to the gate lines of the display section 95.

Also from the driving circuit 75, the shift clock signal and the shift start signal are supplied to the source driver (output means) 70, and from this source driver 70, signal voltages such as an image signal (output from the output means) are outputted through the output signal lines S60 and S61. Note that, hereinafter, a voltage on the output signal line (e.g. S60) is represented with a reference sign identical with that of the corresponding output signal line, such as "voltage S60"). In synchronism with the output of the signal voltages, a switch signal is supplied to the dividing switch circuit 80, and an output from the dividing switch circuit 80 sequentially turns on the dividing switches SWR37 through SWB48. With this, the sequential access to the source lines SR1 through SB12 is realized.

The following will specifically describe how the above-described display section 95 is driven.

EMBODIMENT 1

An embodiment of the present invention is described below in reference to FIGS. 1 and 2.

Figure 2:
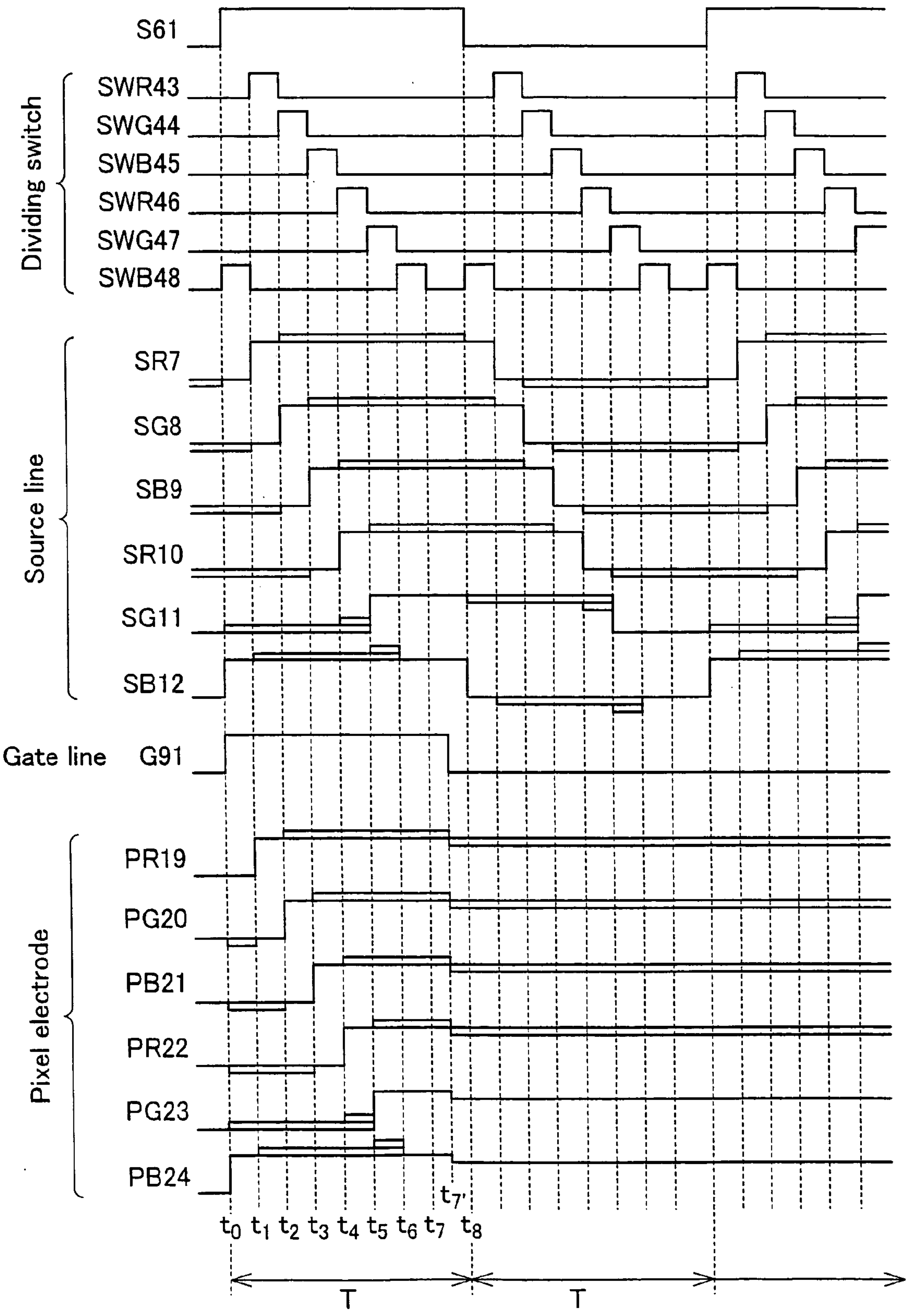
FIG. 2 is a timing chart, illustrating one embodiment of a method of driving the liquid crystal display device of the present invention.

FIG. 2 is a timing chart regarding the block B55 on the occasion of displaying a uniform color, e.g. a halftone, on the whole screen. In the figure, one horizontal period (period for scanning one gate line) is referred to as T. It is also noted that the figure relates to three horizontal periods (periods for scanning three gate lines including the gate lines G90 and G91).

During the period T, the signal voltage S61 is supplied from the source driver 70 to six source lines SR7 through SB12 of the block B55. With this, the signal voltage S61 is written into the pixel electrodes (PR19 through PB24) of the block B55. Also, in synchronism with the aforesaid writing of the signal voltage S61, the signal voltage S60 is written into the pixel electrodes (PR13 through PB18) of the block B54. As a result, during the period T, the signal voltages (e.g. S60 and S61) supplied from the source driver 70 are written into all of the pixel electrodes (PR13, . . . ) connected to the gate line G91. Note that, the source line SR7 corresponds to a starting data line defined in claims and a first starting data line, and the source line SB12 corresponds to a terminating data line defined in claims and a first terminating data line.

By the way, the signal voltages with which the source lines SR7 through SB12 and the pixel electrodes PR19 through PB24 are charged have a driving waveform in which the polarity is periodically reversed at predetermined intervals, such as the signal voltage S61 shown in FIG. 2. In the driving method of the present embodiment, the polarity of the signal voltage S61 is reversed in each horizontal period (first and second predetermined periods) T.

As shown in FIGS. 1 and 2, the gate line G91 is selected (turned on) at a time t0. In synchronism with this, in the driving method of the present embodiment, the initial selection of the terminating data line is performed. More specifically, simultaneously with the supply of an ON signal to the dividing switch SWB48 via the dividing switch line SWL54, the signal voltage S61 is supplied from the source driver 70 to the source line SB12.

On this occasion, the polarity of the voltage on the source line SB12 is reversed from the polarity of the signal voltage supplied in the directly preceding horizontal period (e.g. the period of scanning G90), in other words, reversed from negative to positive. Then the signal voltage S61 of the source driver 70, which has been supplied to the source line SB12, is written into the pixel electrode PB24 via the source and drain of the thin-film transistor TB36.

Then at a time t1, the sequential selection of the starting data line is performed. More specifically, simultaneously with the turn-off of the dividing switch SWB48, the ON signal is supplied to the dividing switch SWR43 via the dividing switch line SWL49. With this, the signal voltage S61 is supplied from the source driver 70 to the source line SR7. On this occasion, the polarity of the voltage on the source line SR7 is reversed from the polarity of the signal voltage supplied in the directly preceding horizontal period, in other words, reversed from negative to positive. Then the signal voltage S61 of the source driver 70, which has been supplied to the source line SR7, is written into the pixel electrode PR19.

Subsequently, simultaneously with the turn-off of the dividing switch SWR43 at a time t2, the ON signal is supplied to the dividing switch SWG44 via the dividing switch line SWL50. With this, the signal voltage S61 is supplied from the source driver 70 to the source line SG8. On this occasion, the polarity of the voltage on the source line SG8 is reversed from the polarity of the signal voltage supplied in the directly preceding horizontal period, in other words, reversed from negative to positive. Then the signal voltage S61 of the source driver 70, which has been supplied to the source line SG8, is written into the pixel electrode PG20.

Similarly, at times t3 through t5, the signal voltage S61 is written into the pixel electrodes PB21 through PG23.

Then at a time t6, the sequential selection of the terminating data line is performed. More specifically, simultaneously with the turn-off of the dividing switch SWG47, the ON signal is supplied to the dividing switch SWB48 via the dividing switch line SWL54. With this, the signal voltage S61 of the source driver 70 is supplied to the source line SB12.

At this stage, since the polarity of the source line SB12 was reversed to positive on the occasion of the selection (turn-on) at the time t0, the (positive) polarity does not change and the voltages on the source line SB12 and the pixel electrode PB24 are rewritten with the signal voltage S61 supplied from the source driver 70.

Incidentally, after the source line SB12 and the pixel electrode PB24 are turned on at the time t0, the voltages on the source line SB12 and the pixel electrode PB24 are overshot at the times t1 and t5. However, the voltages on the source line SB12 and the pixel electrode PB24 are rewritten with desired voltages at the time t6. As a result, these desired voltages are maintained after the gate line G91 is caused to be in the non-selection state at a time t7'.

Note that, since the gate line G91 is changed to the off state, the pixel electrodes PR19 through PR24 maintain the signal voltages having been written into the same, after the time t7'. (By the way, slight voltage variations on the respective pixel electrodes at the time t7' are a common phenomenon on account of the turn-off the gate line G91.)

Figure 4:
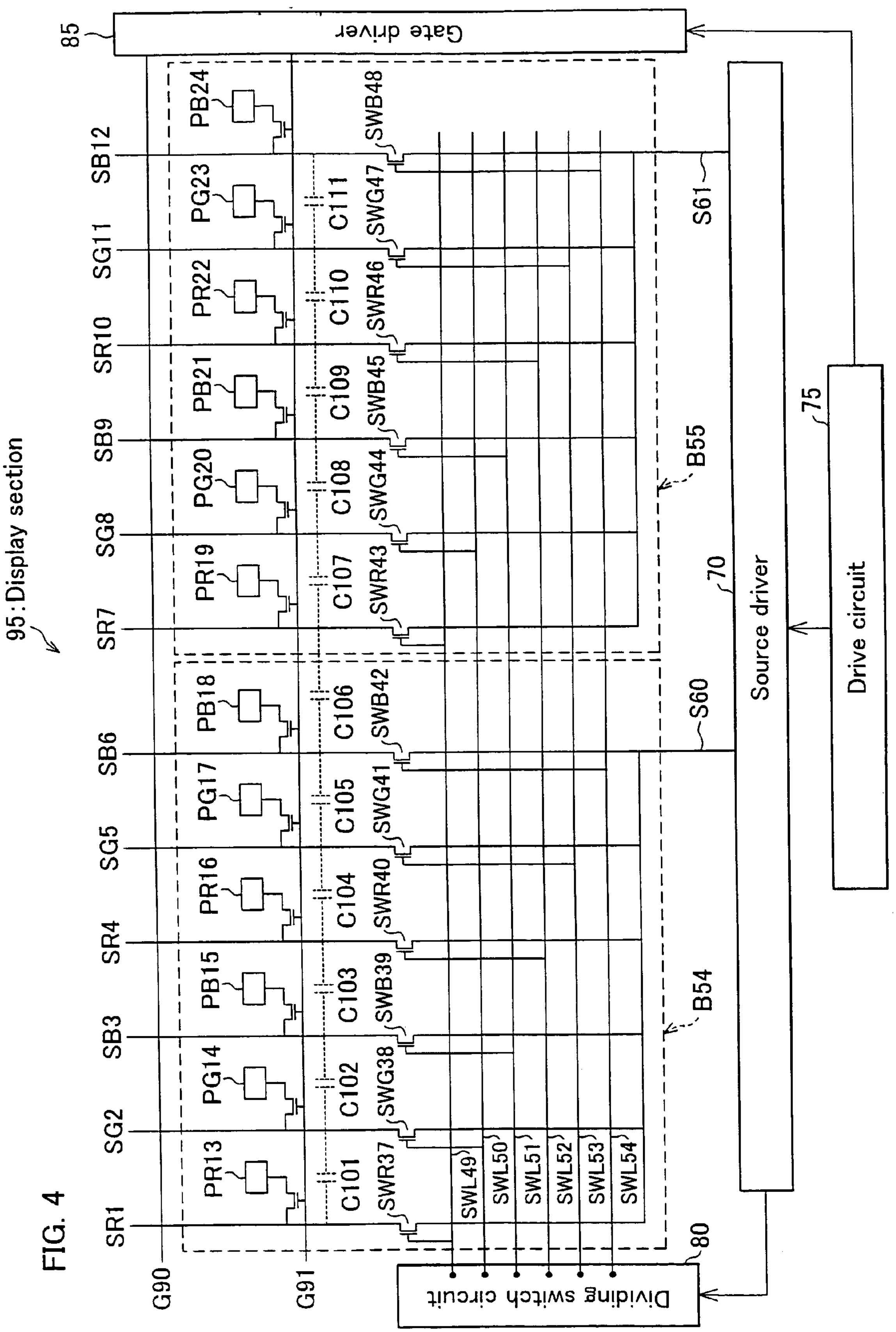
FIG. 4 is a block diagram, illustrating parasitic capacities existing in the display section of the liquid crystal display device of the present invention.
Figure 5:
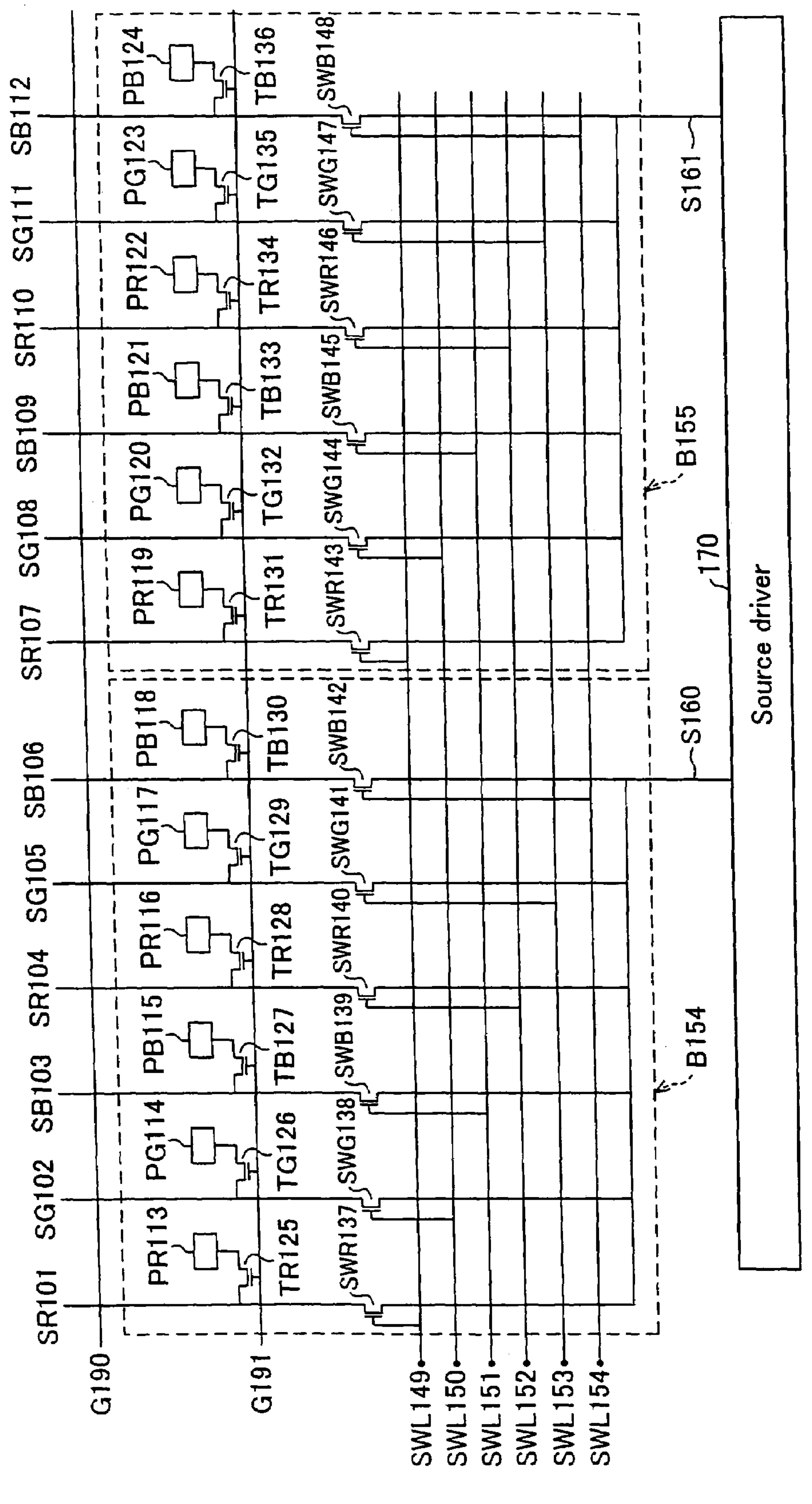
PRIOR ART FIG. 5
FIG. 5 is a block diagram illustrating a display section of a conventional liquid crystal display device.
Figure 6:
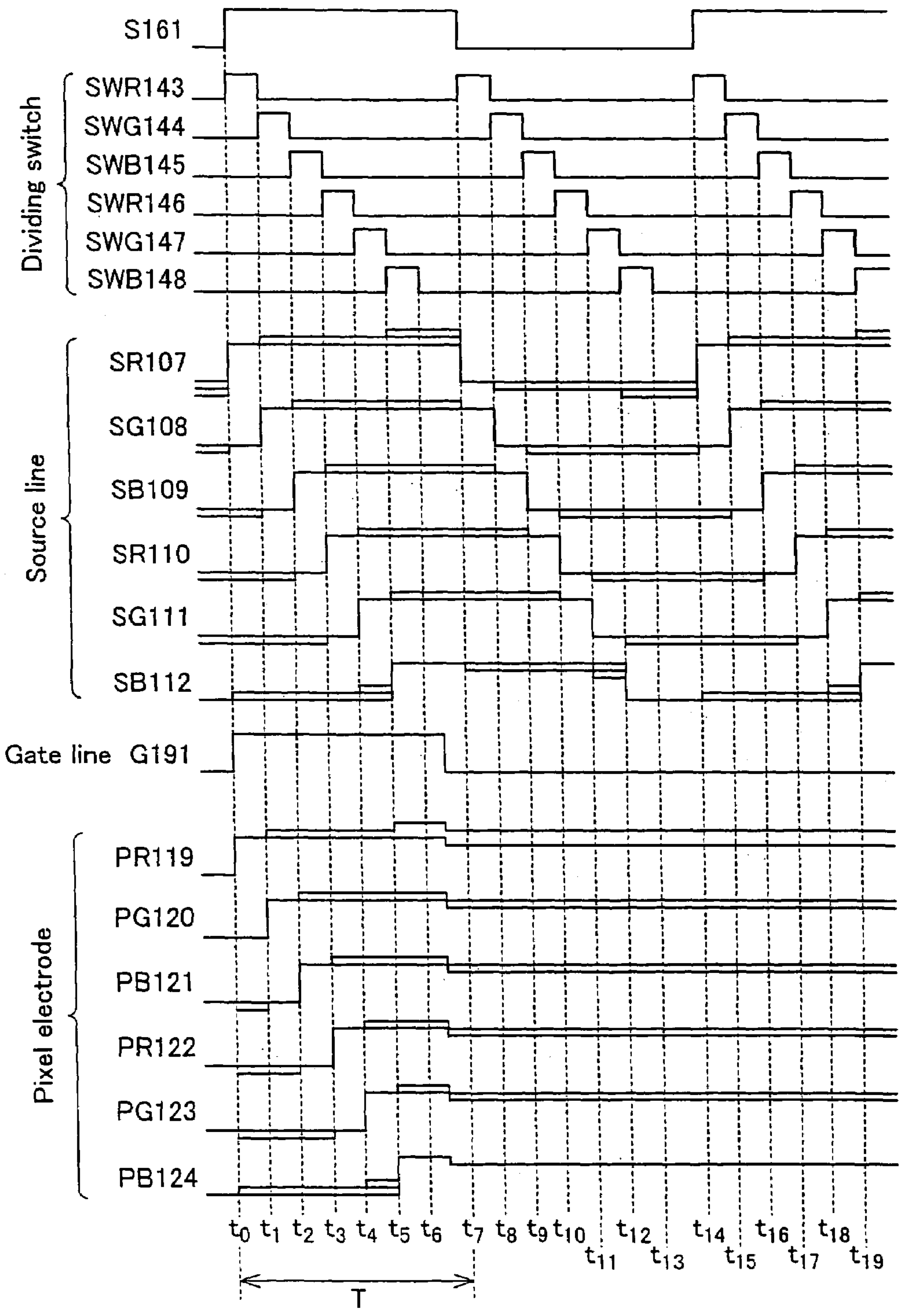
PRIOR ART FIG. 6
FIG. 6 is a timing chart illustrating a method of driving the conventional liquid crystal display device.
Figure 7:
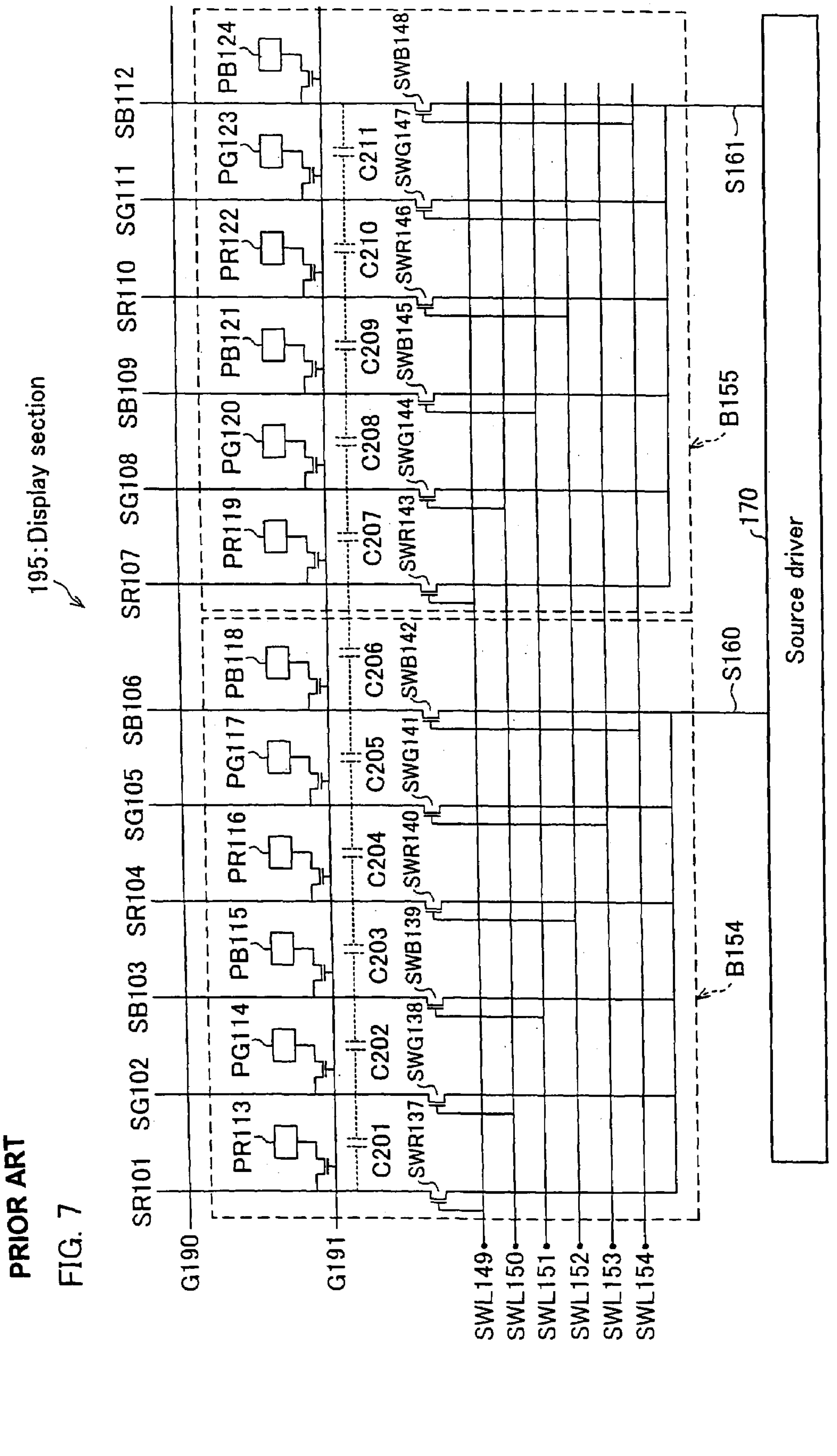
PRIOR ART FIG. 7
FIG. 7 is a block diagram illustrating parasitic capacities existing in the display section of the conventional liquid crystal display device.

According to the aforesaid driving method, the voltage variations on the source lines SR7 and SG11, on account of the parasitic capacities between the source lines, can be restrained, and hence the voltage variations on the pixel electrodes PR19 and PG23 can be restrained as compared to the conventional driving method (cf. FIG. 6). This restriction of the voltage variations is specifically described below. Note that, FIG. 4 schematically illustrates the parasitic capacities (C101 through C111) existing between the source lines SR1 through SB12 of the display section 95.

First, the source line SR7 is discussed. At the time t6, the dividing switch SWB48 is turned on in the block B55. In synchronism with this, in the neighboring block B54, the dividing switch SWB42 is turned on. Note that, however, also in the block B54, the polarity of the source line SB6 (terminating data line, second terminating data line) is reversed (to positive) on the occasion of the selection (turn-on) at the time t1. On this account, at this time t6, the (positive) polarity does not change and the polarity identical with the neighboring source line SR7 is maintained.

At a moment immediately before the time t6, the voltages on the respective source lines SB6 and SR7 have an identical polarity, so that an amount of an electric charge of the parasitic capacity between the source lines SB6 and SR7 is negligibly small. For this reason, at the time t6 at which the dividing switch SWB42 (SWB48) is turned on, the voltage variation on account of the parasitic capacity (C106, see FIG. 4) does not occur on the source line SR7 (and the pixel electrode PR19 connected thereto), the source line SR7 neighboring to the source line SB6.

On the other hand, when the polarity of the source line SB6 is reversed from negative to positive as in the conventional case, the electric charge, which has been charged between the source lines SB6 and SR7 having polarities different from each other, enters the source line SR7, so that the voltages on the source line SR7 and the pixel electrode PR19 are varied due to the aforesaid reversal of polarity (see the conventional art, time t5 in FIG. 6).

Next, the source line SG11 is discussed. At the time t6, the dividing switch SWB48 is turned on. However, as described above, the (positive) polarity of the source line SB112 does not change at this moment, and the (positive) polarity identical with that of the neighboring source line SG11 is maintained.

At a moment immediately before the time t6, the voltages on the source lines SG11 and SB12 have an identical polarity. On this account, an amount of an electric charge of the parasitic capacity between the source lines SG11 and SB12 is negligibly small. For this reason, at the time t6, the voltage variation on account of the parasitic capacity (C111, see FIG. 4) does not occur on the source line SG11 neighboring to the source line SB12.

On the other hand, when, at the time t6, the polarity of the source line SB12 is reversed from negative to positive as in the conventional case, the electric charge, which has been charged between the source lines SG11 and SB12 having polarities different from each other, enters the source line SG11, so that the voltages on the source line SG11 and the pixel electrode PG23 are varied due to the aforesaid reversal of polarity (see the conventional art, time t6 in FIG. 6).

FIG. 2 schematically illustrates the restraint of these voltage variations (overshoots). In this figure, sections where the waveforms of the respective source lines (SR7 through SB12) and pixel electrodes (PR19 through PB24) are overlapped with each other indicate the voltage variations. As in the figure, at a time t8 at which one horizontal period ends (or at the time t7' at which the state of the gate line G91 changes to non-selection), voltages after undergoing the voltage variation once are written into the source lines SR7 through SG10 while voltages having not undergone the voltage variation are written into the source line SG11 and the source line SB12.

On the contrary, as shown in FIG. 6, at the time t7 at which one horizontal period ends (or at a moment when the state of the gate line G191 changes to non-selection), a voltage after undergoing the voltage variation twice is written into the source line SR107, voltages after undergoing the voltage variation once are written into the source lines SG108 through SG111, and a voltage having not undergone the voltage variation is written into the source line SB112.

The following will describe one voltage variation occurring in the source lines SR7 through SG10. For instance, at the time t2 at which the dividing switch SWG44 is turned on, the polarity of the voltage on the source line SG8 is reversed from the polarity of the voltage having been supplied during the directly preceding horizontal period (i.e. reversed from negative to positive).

That is to say, an electric charge (parasitic capacity C107, see FIG. 4), which is charged between the source lines SR7 (positive) and SG8 (negative) having polarities different from each other, enters the source line SR7, as a result of the reversal of the polarity of the source line SG8 (to positive). With this, the voltage variations occur on the source line SR7 and the pixel electrode PR19. The voltage variations on the source lines SG8 through SG10 at the times t3 through t5 are identical to the above.

As described above, according to the driving method of the present embodiment (cf. FIG. 2), in each block (B54, B55), the voltages that do not undergo the voltage variations are written into (i) the pixel electrode where the writing is performed at the last and (ii) the pixel electrode where the writing is performed immediately before the writing to the electrode (i) (i.e. the pixel electrodes PB18 and PG17 in B54 or the pixel electrodes PB24 and PG23 in B55), while voltages each having undergone the voltage variation once are written into the other pixel electrodes (i.e. from the pixel electrode PR13 where the writing is performed at the first to the pixel electrode PR16, and the pixel electrodes PR19 through PR22).

Therefore, the voltage variations on the source lines SR7 and SG11 can be restrained as compared to the conventional driving method (cf. FIG. 6), so that the voltage variations on the pixel electrodes PR19 and PG23 can be restrained. For this reason, it is possible to write signal voltages, which are close to desired voltages, into the pixel electrodes (PR13, . . . ), and hence the vertical striped pattern (light and shade, so to speak) itself, along the source lines on the display section 95, can be reduced.

Moreover, the source line SB6 (first terminating data line) and the source line SR7 (second starting data line) neighboring to each other are a source line that does not undergo the overshoot and a source line that undergoes the overshoot once, respectively. In this manner, it is possible to avoid such a case that the source line that undergoes the overshoot twice is juxtaposed to the source line that does not undergo the overshoot, as in the conventional driving method shown in FIG. 6. As a result, it is possible to cause the vertical striped pattern along the source lines on the display section 95 to be unnoticeable.

As compared to the method disclosed by the patent document 1, the number of divisions (time-division) of the output from the source driver 70 is not limited to 3, so that the number may be 6 (in the present embodiment) or other numbers. Also, the number of output signal lines (S60 and S61) of the source driver 70 can be significantly reduced. (In the present embodiment, the number of the outputs of the source driver 70 can be reduced to ⅙ as compared to the case where the time-division is not performed.) Moreover, since the order of the colors (R, G, and B) corresponding to the source lines (SR1, . . . ) is not limited, the degree of the design freedom is high.

As described above, the method of driving the source lines (SR1, . . . ) of the present embodiment is arranged in such a manner that the source lines (SR1, . . . ) are sequentially driven while the outputs (S60, . . . ) from the source driver 70 are divided by the switches (dividing switches SWR37, . . . ). For this reason, the number of lines connected to the driver 70 is small. In other words, the driving method of the present invention is particularly useful for a medium-sized or small-sized high-resolution panel (e.g. liquid crystal panel). (In addition to the downsizing of the panel, the driving of the source lines is stabilized and high-definition image reproduction is realized.)

EMBODIMENT 2

Figure 3:
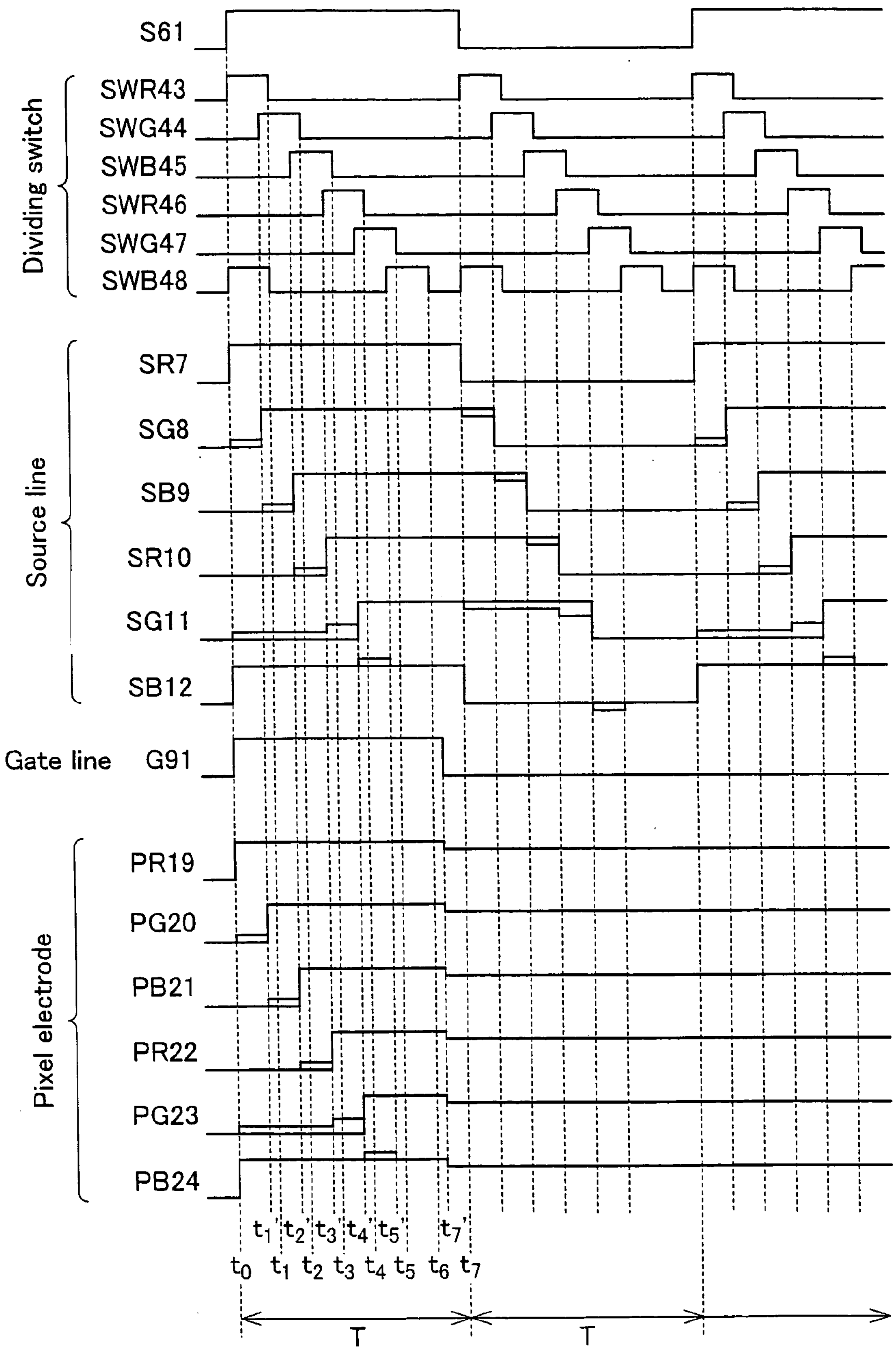
FIG. 3 is a timing chart, illustrating another embodiment of a method of driving the liquid crystal display device of the present invention.

The following will describe another embodiment of the present invention in reference to FIGS. 1 and 3. Note that, a display section of the present embodiment is basically identical with that of Embodiment 1, except that, in the present embodiment, (i) the timings of controlling the dividing switches by the dividing switch circuit and (ii) the timings at which the source driver applies signal voltages to the output signal lines are different from the timings in Embodiment 1. On this account, members of the display section, having the same functions as those described in Embodiment 1, are given the same numbers, so that the descriptions are omitted for the sake of convenience.

FIG. 3 is a timing chart regarding the block B55 (see FIG. 1) on the occasion of displaying a uniform color, e.g. a halftone, on the whole screen. In the figure, one horizontal period (period for scanning one gate line) is referred to as T. It is also noted that the figure relates to three horizontal periods (periods for scanning three gate lines including the gate lines G90 and G91).

During the period T, the signal voltage S61 is supplied from the source driver 70 to six source lines SR7 through SB12 of the block B55, so that the signal voltage S61 is written into the pixel electrodes (PR19 through PB24) of the block B55. In synchronism with this, the signal voltage S60 is written into the pixel electrodes (PR13 through PB18) of the block B54. As a result, during the period T, the signal voltages (S60, S61 and the like) supplied from the source driver 70 is written into all of the pixel electrodes (PR13, . . . ) connected to the gate line G91.

Incidentally, each of the signal voltages with which the source lines SR7 through SB12 and the pixel electrodes PR19 through PB24 are charged has a driving waveform in which the polarity is periodically reversed at predetermined intervals, such as the signal voltage S61 shown in FIG. 3. In the driving method of the present embodiment, the polarity of the signal voltage S61 is reversed in each horizontal period T.

As shown in FIGS. 1 and 3, the gate line G91 is selected (turned on) at a time t0. In synchronism with this, the sequential selection of the source line SR7 that is the starting data line is performed, while the initial selection of the source line SB12 that is the terminating data line is performed. More specifically, at a time t0, an ON signal is supplied to the dividing switch SWR43 via the dividing switch line SWL49, for the sake of the sequential selection of the source line SR7. Also at the time t0, the ON signal is supplied to the dividing switch SWB48 via the dividing switch line SWL54, for the sake of the initial selection of the source line SB12. As a result, the signal voltage S61 is supplied from the source driver 70 to the source lines SR7 and SB12.

On this occasion, the polarity of the voltages on the source lines SR7 and SB12 is reversed from the polarity of the signal voltage supplied in the directly preceding horizontal period (e.g. the period for scanning the line G90), i.e. reversed from negative to positive. Then the signal voltage S61, which has been supplied to the source line SR7, is written into the pixel electrode PR19 via the source and drain of the thin-film transistor TR31, while the signal voltage S61, which has been supplied to the source line SB12, is written into the pixel electrode PB24 via the source and drain of the thin-film transistor TB36.

Subsequently, at a time t1' before the time (t1) at which the dividing switch SWR43 is turned off, the sequential selection of the source line SG8 is performed. More specifically, at the time t1', the ON signal is supplied to the dividing switch SWG44 via the dividing switch line SWL50, while the signal voltage S61 is supplied from the source driver 70 to the source line SG8. That is to say, in the display section 95 of the present embodiment, the source line SG8 is selected before causing the source line SR7, which is the directly preceding line having been selected, to be in the non-selection state (at a time t7).

Note that, also on this occasion, the polarity of the voltage on the source line SG8 is reversed from the polarity of the signal voltage supplied in the directly preceding horizontal period, i.e. reversed from negative to positive. Then the signal voltage S61, which has been supplied from the source driver 70 to the source line SG8, is written into the pixel electrode PG20.

Subsequently, at a time t2' that is before the time (t2) at which the dividing switch SWG44 is turned off, the sequential selection of the source line SB9 is performed. More specifically, at the time t2', the ON signal is supplied to the dividing switch SWB45 via the dividing switch line SWL51, while the signal voltage S61 is supplied from the source driver 70 to the source line SB9. In other words, the selection of the source line SB9 is performed before causing the source line SG8, which is the directly preceding line having been selected, to be in the non-selection state. Then the signal voltage S61, which has been supplied from the source driver 70 to the source line SB9, is written into the pixel electrode PB21.

Similarly, at the times t3' and t4', the signal voltage S61 is supplied from the source driver 70 to the source lines SR10 and SR11, respectively. As a result, the signal voltage S61 is written into the pixel electrodes PR22 and PG23, respectively.

Next, at a time t5' that is before the time (t5) at which the dividing switch SWG47 is turned off, the sequential selection of the source line SB12 that is the terminating data line is performed. More specifically, at the time t5', the ON signal is supplied to the dividing switch SWB48 via the dividing switch line SWL54, while the signal voltage S61 is supplied from the source driver 70 to the source line SB12. Incidentally, since the polarity of the source line SB12 was reversed to positive at the time of the selection (turn-on; initial selection of the terminating data line) at the time t0, the (positive) polarity of the source line SB12 does not change at the time t5', and the voltages on the source line SB12 and the pixel electrode PB24 are rewritten with the signal voltage S61 supplied from the source driver 70. Note that, the voltages on the source line SB12 and the pixel electrode PB24 are overshot at the time t4', after the source line SB12 and the pixel electrode PB24 are turned on at the time t0. For this reason, after the time t7 at which the gate line G91 is changed to be in the non-selection state, the voltages on the source line SB12 and the pixel electrode PB24 are kept at desired voltages.

Since the gate line G91 is changed to the off state, the signal voltages having been written into the pixel electrodes PR19 through PR24 are maintained after the time t7' (By the way, slight voltage variations on the respective pixel electrodes at the time t7' are a common phenomenon on account of the turn-off the gate line G91.)

Now, according to the driving method of the present embodiment, it is possible to restrain the variations of the voltages on the source lines SR7 through SB12 due to the parasitic capacities between the source lines (SR6 through SB12), so that the variations of the voltages having been written into the pixel electrodes PR19 through PB24 can be restrained. How these restraints are realized will be discussed below. Note that, as described above, FIG. 4 schematically illustrates the parasitic capacities C101 through C111 existing between the source lines (SR1 through SB12) of the display section 95.

First, the source line SR7 that is a starting data line is discussed. the source lines (SG8 and SB6) neighboring to the source line SR7 are selected at the time t1' (SG8) and at the time t5' (SB6).

At the time t1', the source line SG8 is selected, and as described above, the polarity of the voltage on the source line SG8 is reversed from the polarity of the signal voltage supplied in the directly preceding horizontal period, i.e. reversed from negative to positive. In the present embodiment, at this time t1', the dividing switch SWR43 connected to the directly preceding source line SR7 is in the on state. From the time t0 to the time t1', an electric charge is charged between the source lines SR7 and SG8 (i.e. parasitic capacity C107) having different polarities (the source line SR7 is positive while the source line SG8 is negative), and at the time t1', the polarity of the source line SG8 is reversed to positive. However, on account of the arrangement above, the aforesaid electric charge (because of the parasitic capacity) escapes to the outside and not to enter the source line SR7.

Thus, being different from the conventional art (see FIG. 6) and Embodiment 1, it is possible to restrain the occurrence of the following phenomenon: An electric charge on account of the parasitic capacity C107 (see FIG. 4) between the source lines SR7 and SG8 enters the source line SR7 and the pixel electrode PR19, so that the voltage having been written into the pixel electrode PR19 is varied (overshot).

At the time t5', the dividing switch SWB48 is turned on. In synchronism with this, the dividing switch SWB42 is turned on in the neighboring block B54. As described above, also in the block B54, the polarity of the source line SB6 has been reversed to positive when the selection (turn-on) is carried out at the time t0. For this reason, the (positive) polarity does not change at the time t5', and is maintained to be identical with the (positive) polarity of the neighboring source line SR7. In other words, it is considered that, before the time t5', an amount of the electric charge (parasitic capacity) between the source lines SB6 (positive) and SR7 (positive) is little (i.e. negligibly small).

Because of the above, when the dividing switch SWB42 (SWB48) is turned on at the time t5', the voltage variation rarely occurs in the source line SR7 (and the pixel electrode PR19 connected to the same), the source line SR7 neighboring to the source line SB6. Note that, as in the conventional case, if, on the occasion above, the polarity of the source line SB6 is reversed from negative to positive, the electric charge between the source lines SB6 and SR7 having polarities different from each other enters the source line SR7, and hence the voltages on the source line SR7 and the pixel electrode PR19 are varied due to the aforesaid reversal of polarity (cf. the time t5 in FIG. 6).

As described above, the present embodiment is different from the aforesaid conventional art (see FIG. 6) and Embodiment 1 in such a point that, in the present embodiment, not only the parasitic capacity C107 between the source lines SR7 and SG8 but also the parasitic capacity C106 between the source lines SB6 and SR7 do not induce the voltage variation on the source line SR7. For this reason, after the time t7', voltages having not undergone the voltage variations (i.e. desired signal voltages) are written into the source line SR7 and the pixel electrode PR19.

Furthermore, as to the source line SG8, the variation (overshoot) of the voltage having been written into the pixel electrode PG20 can be restrained in the following manner: While the polarity of the source line SB9 is reversed from negative to positive at the time t2', the dividing switch SWG44 is kept in the on state. Therefore, it is possible to restrain the flow of an electric charge, which is caused by the parasitic capacity between the source lines SG8 and SB9, into the source line SG8 and the pixel electrode PG20. As a result, it is possible to restrain the variation (overshoot) of the voltage having been written into the pixel electrode PG20.

Apart from the aforesaid source line SG8, the same applies to the source lines SB9 and SR10. It is therefore possible to restrain the flow of the electric charges, which are caused by the parasitic capacities 109 and 110 (see FIG. 4), into the source lines SB9 and SR10 and the pixel electrodes PB21 and PR22, respectively. As a result, it is possible to restrain the variations (overshoots) of the voltages having been written into the pixel electrodes PB21 and PR22.

As to the source line SG11, the voltage variation does not occur when the source line SB12 is selected at the time t5, because of the following reason: That is, the polarity of the source line SB12 was reversed (to positive) on the occasion of the selection at the time t0. Therefore, at the time t5', the (positive) polarity does not change and the (positive) polarity identical with the polarity of the neighboring source line SG11 is maintained. In other words, it is considered that, before the time t5', an amount of the electric charge (parasitic capacity) between the source lines SG11 (positive) and SB12 (positive) is little (i.e. negligibly small). For this reason, when the dividing switch SWB48 is turned on at the time t5', the voltage variation rarely occurs in the source line SG11 (and the pixel electrode PG23 connected to the same).

The voltage on the source line SB12 is overshot at the time t4', after the source line SB12 is turned on at the time t0. However, on the occasion of the sequential selection at the time t5', the voltage on the source line SB12 is rewritten to be a desired voltage. Therefore, even after the time t7' at which the gate line G91 is changed to the non-selection state, the desired voltage is maintained.

FIG. 3 schematically shows the above-described restraint of the voltage variation (overshoot) in the present embodiment. In the figure, the sections where the waveforms of the source lines (SR7 through SB12) and pixels electrodes (PR19 through PB24) are overlapped with each other indicate the voltage variations.

As shown in FIG. 3, in the block B55 (see FIG. 1), after one horizontal period that starts at the time t0 and ends at the time t7' (i.e. after the time t7' at which the gate line G91 is changed to the non-selection state), voltages having not undergone the voltage variations (overshoots), i.e. desired voltages, are written into all of the pixel electrodes (PR19 through PB24).

On account of this, when the driving method of the present embodiment (see FIG. 3) is adopted, desired signal voltages are written into all of the pixel electrodes (PR13 through PB18 or PR19 through PB24) of each block (B54 or B55), after one horizontal period (i.e. a period during which the gate line G91 is not selected, starting from the time t7').

Moreover, as compared to the method by which desired voltages are written into the respective source lines after all of the dividing switches SWR37 through SWB48 (corresponding to the source lines SR1 through SB12) are turned on, the aforesaid method of the present embodiment makes it possible to write desired voltages into the respective source lines, while restraining the load on the drive circuit 75 (see FIG. 1), the dividing switch circuit 80, and the like.

Therefore, the signal voltages written into the pixel electrodes (PR13, . . . ) are closer to desired voltages, as compared to the conventional method illustrated in FIG. 6. On this account, the influence of the voltage variations can be significantly restrained in the display section 95 on the whole, and hence it is possible to cause the striped pattern on a reproduced image to be inconspicuous to a great extent.

Moreover, being different from the method taught by the patent document 1, the number of divisions (time-division) of the output from the source driver 70 is not limited to 3, so that the number may be 6 (in the present embodiment) or other numbers. Also, the number of output signal lines (S60 and S61) of the source driver 70 can be significantly reduced. (In the present embodiment, the number of the outputs of the source driver 70 can be reduced to ⅙ as compared to the case where the time-division is not performed.) Moreover, since the order of the colors (R, G, and B) corresponding to the source lines (SR1, . . . ) is not limited, the degree of the design freedom is high.

As described above, the method of driving the data lines (source lines) of the present invention is arranged in such a manner that the source lines (SR1, . . . ) are sequentially driven while the outputs (S60, . . . ) from the source driver 70 are divided by the switches (dividing switches SWR37, . . . ). For this reason, the number of lines connected to the driver 70 is small. In other words, the driving method of the present invention is particularly useful for a medium-sized or small-sized high-resolution panel (e.g. liquid crystal panel) that has restrictions in the outer shape and the pitch of lines. (In addition to the downsizing of the panel, the driving of the source lines is stabilized and high-definition image reproduction is realized.)

Note that, in Embodiment 2, the ON signal is supplied to the dividing switch SWB48 at the time t0 and the selection of the source line SB12 (i.e. the initial selection of the terminating data line) is performed. However, this selection is not necessarily performed at the time t0 (i.e. it is not necessary to perform the selection in synchronism with the sequential selection of the source line SR7 that is the starting data line).

This selection in addition to the sequential selection of the source line SB12 (i.e. the selection before the sequential section) can be performed any time until the time t1 at which the source line SR7 is turned off. For instance, the aforesaid selection may be performed at a time T1' that is between the time t1' (at which the source line SG8 is selected) and the time t1 (at which the source line SR7 is turned off). (By the way, the source line SB12 is turned off at a predetermined time before the sequential section of the same at the time t5'.)

In this case, the polarity of the voltage on the source line SR7 is reversed to positive at the time t0, and from this time to the time T1', the polarity of the source line SB6 is identical with the (negative) polarity of the voltage supplied in the directly preceding horizontal period, while the polarity of the source line SR7 is opposite to the above (i.e. the polarity of the source line SR7 is positive). For this reason, an electric charge (parasitic capacity) between these source lines is not negligible. However, even though the source line SB6 (SB12) is selected at the time T1' and the polarity thereof is reversed from negative to positive, the dividing switch SWR43 opens also at the time T1', and the source line SR7 is caused to be in the selection (on) state. In this manner, it is possible to restrain the entrance of the aforesaid electric charge into the source line SR7 and pixel electrode PR19, i.e. it is possible to allow the charge to escape to the outside.

It is noted that, in this case, the time T1 at which the source line SB6 is selected is close to the time t1' at which the source line SG8 is selected. For this reason, the source lines on the both sides of the source line SR7 are almost successively turned on, so that the source line SR7 (pixel electrode PR19) is liable to be influenced by the parasitic capacities (C106 and C107).

Taking this into consideration, the initial selection regarding this source line SB12 is preferably performed well before the time t1 at which the source line SR7 is turned off, e.g. the initial selection is performed at the time t0 as in the present embodiment.

Also, in Embodiment 2, the source line SB12 may be selected before the selection of the source line SR7 that is the starting data line. For instance, it is possible to implement the following arrangement: In synchronism with or after the turn-on of the gate line G91, the source line SB12 that is the terminating data line is selected, and then the sequential selection from the starting data line (source line SR7) to the terminating data line (source line SB12) is performed.

Note that, in Embodiments 1 and 2, one output from the source driver 70 is divided by six dividing switches (e.g. the switches SWR37 through SWB42 in the block B54), and six source lines (e.g. the source lines SR1 through SB6 in the block B54) are driven. However, apart from this arrangement, any types of arrangements may be adopted as long as one output from the source driver is divided by predetermined switches, and a plurality of source lines are driven.

Moreover, the order of colors corresponding to the respective source lines (SR1, SG2, SB3, . . . ) is not limited to R, G, and B. For instance, the source line that is initially subjected to the writing in each block may correspond to B (blue).

Also, the period (overlap period) from the selection of each source line (SR2, SG2, SB3, . . . , or SB12) to the turn-off of the selection of the directly preceding data line (SR1, SG2, SB3, . . . , or SG11) may be determined with reference to the delay time regarding the selection of the source line (e.g. the delay time of the ON signal supplied to the dividing switch SWR37 and the like, due to the reasons such as the wire resistance of the lines SWL49 through 54.

The method of the present invention may be paraphrased in the following manner: The driving method is arranged in such a manner that, one output signal line (S61 and the like) is divided and pluralized by switches (SWR43, . . . ), so that a plurality of source lines (SR7, . . . ) are driven and the polarity of the voltage applied to the liquid crystal is reversed in each horizontal period T, the driving method being characterized in that the switches are turned on in the order of SWB48, SWR43, SWG44, . . . , and SWB48.

The liquid crystal display device of the present invention may be paraphrased in the following manner: The liquid crystal display device is arranged in such a manner that, one output signal line (S61 and the like) is divided and pluralized by switches (SWR43, . . . ), so that a plurality of source lines (SR7, . . . ) are driven and the polarity of the voltage applied to the liquid crystal is reversed in each horizontal period T, the liquid crystal display device being characterized in that the switches are turned on in the order of SWB48, SWR43, SWG44, . . . , and SWB48.

As described above, a method of driving a plurality of data lines is characterized in that, for causing output means to perform writing into the plurality of data lines, one output from the output means being divided into divided outputs corresponding to the plurality of data lines, the plurality of data lines being grouped into groups each made up of data lines from a starting data line to a terminating data line, the method comprising the steps of: in each of said groups, (I) providing a signal voltage of one of said divided outputs to a data line selected by a switch, during a first predetermined period; and (II) providing a signal voltage, whose polarity is opposite to a polarity of the signal voltage in the step (I), to a data line selected by a switch, during a second predetermined period subsequent to the first predetermined period, the step (I) comprising the sub-step of: (i) performing sequential selection of the data lines from the starting data line to the terminating data line; and (ii) apart from the sequential selection of the terminating data line, selecting the terminating data line before causing the starting data line to be in an off state, the step (II) comprising the sub-step of: (a) performing sequential selection of the data lines from the starting data line to the terminating data line; and (b) apart from the sequential selection of the terminating data line, selecting the terminating data line before causing the starting data line to be in an off state, the sub-steps (i) in the respective groups being synchronized with each other, the sub-steps (ii) in the respective groups being synchronized with each other, the sub-steps (a) in the respective groups being synchronized with each other, and the sub-steps (b) in the respective groups being synchronized with each other.

According to the aforesaid method, in the sub-step (i) of the step (I), a data line is selected before causing a directly preceding line to be in an off state, and in the sub-step (a) of the step (II), a data line is selected before causing a directly preceding line to be in an off state.

According to the aforesaid method, the sub-step (ii) of the step (I) is performed before selecting the starting data line in the sub-step (i) of the step (I), and the sub-step (b) of the step (II) is performed before selecting the starting data line in the sub-step (a) of the step (II).

According to the aforesaid method, the sub-step (ii) of the step (I) is performed in synchronism with the selection of the starting data line in the sub-step (a) of the step (II).

According to the aforesaid method, the polarity of the signal voltage of one of said divided outputs is periodically reversed at predetermined intervals.

The aforesaid method may be arranged as follows: the plurality of data lines are source lines corresponding to respective pixels of a display device, the output means is a source driver that outputs the signal voltage, and each of the first and second predetermined periods is one horizontal period.

A display device of the present invention is characterized by executing a method of driving a plurality of data lines, for causing output means to perform writing into the plurality of data lines, one output from the output means being divided into divided outputs corresponding to the plurality of data lines, the plurality of data lines being grouped into groups each made up of data lines from a starting data line to a terminating data line, the method comprising the steps of: in each of said groups, (I) providing a signal voltage of one of said divided outputs to a data line selected by a switch, during a first predetermined period; and (II) providing a signal voltage, whose polarity is opposite to a polarity of the signal voltage in the step (I), to a data line selected by a switch, during a second predetermined period subsequent to the first predetermined period, the step (I) comprising the sub-step of: (i) performing sequential selection of the data lines from the starting data line to the terminating data line; and (ii) apart from the sequential selection of the terminating data line, selecting the terminating data line before causing the starting data line to be in an off state, the step (II) comprising the sub-step of: (a) performing sequential selection of the data lines from the starting data line to the terminating data line; and (b) apart from the sequential selection of the terminating data line, selecting the terminating data line before causing the starting data line to be in an off state, the sub-steps (i) in the respective groups being synchronized with each other, the sub-steps (ii) in the respective groups being synchronized with each other, the sub-steps (a) in the respective groups being synchronized with each other, and the sub-steps (b) in the respective groups being synchronized with each other.

A liquid crystal display device of the present invention is characterized by executing a method of driving a plurality of data lines, for causing output means to perform writing into the plurality of data lines, one output from the output means being divided into divided outputs corresponding to the plurality of data lines, the plurality of data lines being grouped into groups each made up of data lines from a starting data line to a terminating data line, the method comprising the steps of: in each of said groups, (I) providing a signal voltage of one of said divided outputs to a data line selected by a switch, during a first predetermined period; and (II) providing a signal voltage, whose polarity is opposite to a polarity of the signal voltage in the step (I), to a data line selected by a switch, during a second predetermined period subsequent to the first predetermined period, the step (I) comprising the sub-step of: (i) performing sequential selection of the data lines from the starting data line to the terminating data line; and (ii) apart from the sequential selection of the terminating data line, selecting the terminating data line before causing the starting data line to be in an off state, the step (II) comprising the sub-step of: (a) performing sequential selection of the data lines from the starting data line to the terminating data line; and (b) apart from the sequential selection of the terminating data line, selecting the terminating data line before causing the starting data line to be in an off state, the sub-steps (i) in the respective groups being synchronized with each other, the sub-steps (ii) in the respective groups being synchronized with each other, the sub-steps (a) in the respective groups being synchronized with each other, and the sub-steps (b) in the respective groups being synchronized with each other.

As described above, a method of driving data lines of the present invention is arranged in such a manner that, in each of the predetermined periods, the sequential selection of the data lines from the starting data line to the terminating data line is performed, and in addition to this sequential selection, the terminating data line is selected before causing the starting data line to be in the off state, the groups of the data lines being synchronized with each other on the occasion of performing the above.

In the aforesaid method, a group corresponding to one output has data lines from a starting data line to a terminating data line, and at the border between two neighboring groups, the starting data line of one group is juxtaposed with the terminating data line of the other group.

According to the above-described method, in each of the predetermined periods, apart from the sequential selection from the starting data line to the terminating data line, the selection of the terminating data line (hereinafter, this selection of the terminating data line is at times referred to as initial selection) is performed. In other words, the terminating data line is selected twice in one predetermined period, e.g. the initial selection is the first time and the sequential selection is the second time.

Therefore, the data lines (hereinafter, at times referred to as data lines from the first starting data line to the first terminating data line) are driven in the following manner.

First, before or after the sequential selection of the first starting data line, the initial selection of the first terminating data line is performed. This initial selection can be performed either before or after the selection (sequential selection) of the first starting data line, on condition that the initial selection is performed before the turn-off of the sequentially-selected first starting data line.

As a result of this initial selection, a signal voltage is supplied from the output means to the first terminating data line. Since this signal voltage has a polarity opposite to the (e.g. negative) polarity of a signal voltage supplied on the occasion of the sequential selection during the first predetermined period, the polarity of the voltage on the first terminating data line is reversed (from negative to positive). Furthermore, in synchronism with this selection of the first terminating data line, the terminating data line, which belongs to the group neighboring to the group of the aforesaid first terminating data line and is next to the first starting data line, is selected, and a signal voltage from the output means is supplied to this terminating data line. With this, the polarity of the voltage on the second terminating data line is also reversed (from negative to positive).

On this occasion, since the initial selections of the first and second terminating data lines are performed before causing the first starting data line not to be in the state of selection (sequential selection), the first starting data line does not, on the occasion of the aforesaid initial selection, suffer from the voltage variation on account of a parasitic capacity between the first starting data line and the second terminating data line.

After the initial selection of the first terminating data line (or before the initial selection as described above), the first starting data line is selected (i.e. the sequential selection of the first starting data line is performed). As a result, a signal voltage is supplied from the output means to the first starting data line. Subsequently, the sequential selections up to the first terminating data line are performed.

On the occasion of this sequential selection (selection for the second time) of the first terminating data line, the polarity of the first terminating data line has been reversed (to positive) since the initial selection (selection for the first time), and hence the polarity of the first terminating data line does not change (i.e. remains positive) on the occasion of the sequential selection (selection for the second time).

In synchronism with the sequential selection (selection for the second time) of the first terminating data line, the second terminating data line is also subjected to the sequential selection (i.e. selected for the second time). The polarity of this second terminating data line has also been identical with the (positive) polarity of the first starting data line, since the initial selection (selection for the first time). For this reason, the polarity of the second terminating data line does not change (remains positive) at the time of the sequential selection (selection for the second time).

Note that, by the sequential selection (selection for the second time) of the first terminating data line, a desired signal voltage is eventually supplied from the output means to the first terminating data line.

As a result of the above-described driving of the data lines, the following effects can be obtained.

First, as described above, on the occasion of the sequential selections (selections for the second time) of the first and second terminating data lines as the last selections in the respective predetermined periods, the polarity of the second terminating data line does not change from the polarity that was set at the time of the initial selection (selection for the first time) and is identical with the (positive) polarity of the first starting data line that is next to the second terminating data line. At this moment, an electric charge (parasitic capacity) between the second terminating data line and the first starting data line having an identical polarity is negligibly small, as compared to a case where these data lines have different polarities.

On this account, it is possible to prevent the voltage variation of the first starting data line on account of the parasitic capacity, when the first terminating data line is subjected to the sequential selection (i.e. is selected for the second time).

Also, on the occasion of the sequential selections (selections for the second time) of the first and second terminating data lines, the polarity of the first terminating data line does not change from the polarity that was set at the time of the initial selection (selection for the first time) and is identical with the (positive) polarity of the neighboring (directly preceding) data line. As described above, an electric charge (parasitic capacity) between the neighboring data lines having an identical polarity is negligibly small.

For this reason, it is possible to prevent the voltage variation that is caused by the parasitic capacity from occurring to the data line immediately prior to the first terminating data line, when the first terminating data line is subjected to the sequential selection.

In this manner, according to the aforesaid method, the numbers of the voltage variations on the data lines immediately prior to the starting and terminating data lines, the voltage variations being caused by the parasitic capacities, can be decreased for once, respectively, as compared to the conventional art illustrated in FIG. 6.

With this, when, for instance, the data lines are adopted as source lines for writing signal voltages to pixels (pixel electrodes) of a display device, the occurrence of a vertically-striped pattern along the source lines is restrained.

Furthermore, since the voltage variation of the starting data line neighboring to the terminating data line (that does not suffer from the voltage variation on account of the parasitic capacity) is restrained, the occurrence of a vertically-striped pattern is caused to be unnoticeable when the aforesaid data lines are adopted to source lines of a display device, as compared to the conventional art (see FIG. 6) in which a source line undergoing the voltage variation twice is provided next to a source line not undergoing the voltage variation.

Furthermore, when, as described above, the aforesaid data lines are adopted as source lines of a (color) display device, the number of divisions by switches is not limited as in the conventional art disclosed by the patent document 1, and the order of colors (e.g. the order of R, G, and B) corresponding to the respective data (source) lines can be freely determined. For these reasons, the design freedom of the device is increased as compared to the conventional art.

In addition to the above, the method of driving the data lines in accordance with the present invention is preferably arranged in such a manner that, in the sub-step (i) of the step (I), a data line is selected before causing a directly preceding line to be in an off state, and in the sub-step (a) of the step (II), a data line is selected before causing a directly preceding line to be in an off state.

According to this method, in the sequential selection in each of the predetermined periods, when one data line (one of the data lines from the starting data line to the terminating data line) is selected (turned on) by the switch, the data line that was selected immediately before the selection of said one data line is in the on state and not in an electrically floating state. On this account, an electric charge owing to a parasitic capacity between one data line and the neighboring data line is allowed to escape to the outside of the neighboring data line, even if said one data line is selected (turned on) by the switch and the polarity thereof is reversed from the polarity of a signal voltage that was written during the first predetermined period.

As a result, it is possible to prevent such a drawback that the electric charge on account of the parasitic capacity flows into the neighboring data line in a floating state, so that the voltage on this data line is varied. In other words, the voltages on the data lines from the starting data line to the terminating data line rarely vary due to the parasitic capacities, on the occasion of the sequential selection. Incidentally, as described above, also on the occasion of the initial selection of the terminating data line, the voltages on the data lines (e.g. starting data line) do not vary due to the parasitic capacities.

In summary, according to the aforesaid method, the voltages on the data lines from the starting data line to the terminating data line rarely vary due to the parasitic capacities.

With this, when, for instance, the data lines are adopted as source lines for writing signal voltages to pixels (pixel electrodes) of a display device, the occurrence of a vertically-striped pattern along the source lines is significantly restrained.

Also, the method of driving the data lines in accordance with the present invention is preferably arranged in such a manner that, the sub-step (ii) of the step (I) is performed before selecting the starting data line in the sub-step (i) of the step (I), and the sub-step (b) of the step (II) is performed before selecting the starting data line in the sub-step (a) of the step (II).

According to this method, the starting data line is in the off state on the occasion of the initial selection of the terminating data line. That is, before the initial selection, these data lines have an identical polarity (i.e. polarity of the signal voltage supplied in the first predetermined period). For this reason, the aforesaid method makes it possible to certainly avoid the influence of the parasitic capacity on the starting data line, on the occasion of the aforesaid initial selection.

Also, the method of driving the data lines in accordance with the present invention is preferably arranged in such a manner that, the sub-step (ii) of the step (I) is performed in synchronism with the selection of the starting data line in the sub-step (a) of the step (II).

According to this method, the predetermined period (first and second predetermined period) for providing the signal voltage to the data lines from the starting data line to the terminating data line can be shortened, as compared to a case where the initial selection of the terminating data line is carried out before the sequential selection of the starting data line (i.e. a case where the initial selection of the terminating data line is carried out not in synchronism with the sequential selection of the starting data line).

Also, the method of driving the data lines in accordance with the present invention is preferably arranged in such a manner that, the polarity of the signal voltage of one of said divided outputs is periodically reversed at predetermined intervals.

In this case, the aforesaid method can be adopted for driving a display device (e.g. liquid crystal display device) in which the polarity of a signal voltage written into each data line (source line) is periodically reversed, thereby restraining the voltage variation on the data line (source line) as described above.

Also, the method of driving the data lines in accordance with the present invention is preferably arranged in such a manner that, the plurality of data lines are source lines corresponding to respective pixels of a display device, the output means is a source driver that outputs the signal voltage, and each of the first and second predetermined periods is one horizontal period.

One horizontal line is a period until the aforesaid output (signal voltage) is supplied to all of the source lines.

According to the method above, the voltage variation on account of the parasitic capacity is restrained in the liquid crystal display device in a practical manner, so that a signal voltage close to a target voltage is written into each source line. For this reason, the occurrence of, for instance, a striped pattern along the source lines (i.e. in a vertical direction) is restrained.

Moreover, the number of divisions by switches is not limited as in the conventional art disclosed by the patent document 1, and the order of colors (e.g. the order of R, G, and B) corresponding to the respective source lines can be freely determined. Therefore, the degree of design freedom for the device is increased.

In addition to the above, the method of driving the display device or data lines is arranged in such a manner that, the output means controls the switches in each of the groups, so as to cause the data lines except the starting data line and the terminating data line to be in a non-selection state, while the starting data line and the terminating data line are selected by the switches.

According to this arrangement, while the starting data line and terminating data line are selected, the number of data lines that the output means must drive is only two for each output of the output means. In this manner, the output means is not required to have high driving ability.

As described above, according to the method of driving the data lines of the present invention, the voltage variation on each data line on account of a parasitic capacity between data lines can be restrained (or eliminated) on the occasion of writing an output from output means into the data lines. Therefore, the aforesaid method can be adopted to, for instance, a display device (e.g. liquid crystal display device) in which a signal voltage, which is supplied from a data driver that is output means, is written into each of source lines corresponding to respective pixel electrodes. (The method is particularly effective for a small-sized or medium-sized high-resolution panel that has restrictions in the outer shape and the pitch of lines.)

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims. Also, the technical scope of the present invention encompasses an embodiment in which technical means disclosed in different embodiments are appropriately combined with each other.

What is claimed is:

1. A method of driving a plurality of data lines, for causing output means to perform writing into the plurality of data lines, one output from the output means being divided into divided outputs corresponding to the plurality of data lines, the plurality of data lines being grouped into groups each made up of data lines from a starting data line to a terminating data line, the method comprising the steps of:

in each of said groups, (I) providing a signal voltage of one of said divided outputs to a data line selected by a switch, during a first predetermined period; and (II) providing a signal voltage, whose polarity is opposite to a polarity of the signal voltage in the step (I), to a data line selected by a switch, during a second predetermined period subsequent to the first predetermined period, the step (I) comprising the sub-step of:

(i) performing sequential selection of the data lines from the starting data line to the terminating data line; and (ii) apart from the sequential selection of the terminating data line, selecting the terminating data line before causing the starting data line to be in an off state, the step (II) comprising the sub-step of:

(a) performing sequential selection of the data lines from the starting data line to the terminating data line; and (b) apart from the sequential selection of the terminating data line, selecting the terminating data line before causing the starting data line to be in an off state, the sub-steps (i) in the respective groups being synchronized with each other, the sub-steps (ii) in the respective groups being synchronized with each other, the sub-steps (a) in the respective groups being synchronized with each other, and the sub-steps (b) in the respective groups being synchronized with each other.

2. The method as defined in claim 1, wherein, in the sub-step (i) of the step (I), a data line is selected before causing a directly preceding line to be in an off state, and in the sub-step (a) of the step (II), a data line is selected before causing a directly preceding line to be in an off state.

3. The method as defined in claim 1, wherein, the sub-step (ii) of the step (I) is performed before selecting the starting data line in the sub-step (i) of the step (I), and the sub-step (b) of the step (II) is performed before selecting the starting data line in the sub-step (a) of the step (II).

4. The method as defined in claim 1, wherein, the sub-step (ii) of the step (I) is performed in synchronism with the selection of the starting data line in the sub-step (a) of the step (II).

5. The method as defined in claim 1, wherein, the polarity of the signal voltage of one of said divided outputs is periodically reversed at predetermined intervals.

6. The method as defined in claim 1, wherein, the plurality of data lines are source lines corresponding to respective pixels of a display device, the output means is a source driver that outputs the signal voltage, and each of the first and second predetermined periods is one horizontal period.

7. A display device executing a method of driving a plurality of data lines, for causing output means to perform writing into the plurality of data lines, one output from the output means being divided into divided outputs corresponding to the plurality of data lines, the plurality of data lines being grouped into groups each made up of data lines from a starting data line to a terminating data line, the method comprising the steps of:

in each of said groups, (I) providing a signal voltage of one of said divided outputs to a data line selected by a switch, during a first predetermined period; and (II) providing a signal voltage, whose polarity is opposite to a polarity of the signal voltage in the step (I), to a data line selected by a switch, during a second predetermined period subsequent to the first predetermined period, the step (I) comprising the sub-step of:

(i) performing sequential selection of the data lines from the starting data line to the terminating data line; and (ii) apart from the sequential selection of the terminating data line, selecting the terminating data line before causing the starting data line to be in an off state, the step (II) comprising the sub-step of:

(a) performing sequential selection of the data lines from the starting data line to the terminating data line; and (b) apart from the sequential selection of the terminating data line, selecting the terminating data line before causing the starting data line to be in an off state, the sub-steps (i) in the respective groups being synchronized with each other, the sub-steps (ii) in the respective groups being synchronized with each other, the sub-steps (a) in the respective groups being synchronized with each other, and the sub-steps (b) in the respective groups being synchronized with each other.

8. A liquid crystal display device executing a method of driving a plurality of source lines, for causing output means to perform writing into the plurality of data lines, one output from the output means being divided into divided outputs corresponding to the plurality of data lines, the plurality of data lines being grouped into groups each made up of data lines from a starting data line to a terminating data line, the method comprising the steps of:

in each of said groups, (I) providing a signal voltage of one of said divided outputs to a data line selected by a switch, during a first predetermined period; and (II) providing a signal voltage, whose polarity is opposite to a polarity of the signal voltage in the step (I), to a data line selected by a switch, during a second predetermined period subsequent to the first predetermined period, the step (I) comprising the sub-step of:

(i) performing sequential selection of the data lines from the starting data line to the terminating data line; and (ii) apart from the sequential selection of the terminating data line, selecting the terminating data line before causing the starting data line to be in an off state, the step (II) comprising the sub-step of:

(a) performing sequential selection of the data lines from the starting data line to the terminating data line; and (b) apart from the sequential selection of the terminating data line, selecting the terminating data line before causing the starting data line to be in an off state, the sub-steps (i) in the respective groups being synchronized with each other, the sub-steps (ii) in the respective groups being synchronized with each other, the sub-steps (a) in the respective groups being synchronized with each other, and the sub-steps (b) in the respective groups being synchronized with each other.

9. A display device, comprising:

groups each made up of a plurality of data lines;

output means for providing outputs to the respective groups; and switches that are provided in each of the groups, divide one of the outputs, which are supplied from the output means to a corresponding group, into divided outputs, and supply the divided outputs to the respective data lines of the corresponding group, the output means (i) providing a signal voltage of the divided outputs to the data lines selected by the switches, in a first predetermined period, while (ii) providing a signal voltage, whose polarity is opposite to a polarity of the signal voltage in (i), to the data lines selected by the switches, in a second predetermined period, and provided that, among the data lines in each of the groups, a data line provided at a leader part is termed a starting data line while a data line provided at an end part is termed a terminating data line, in each of the first and second predetermined periods, (a) sequential selection of the data lines from the starting data line to the terminating data line being performed, and (b) apart from the sequential selection of the terminating data line, the terminating data line is selected before causing the starting data line to be in an off state, said groups being synchronized with each other when (a) and (b) are carried out.

10. The display device as defined in claim 9, wherein, the display device is a liquid crystal display device.

11. The display device as defined in claim 9, wherein, the output means controls the switches in each of the groups, so as to cause the data lines except the starting data line and the terminating data line to be in a non-selection state, while the starting data line and the terminating data line are selected by the switches.

* * * * *